US012713674B2

(12) United States Patent
Li et al.

(10) Patent No.: US 12,713,674 B2

(45) Date of Patent: Aug. 18, 2026

(54) SELF-ALIGNED CONTACT STRUCTURES AND METHODS FOR MAKING THE SAME

(71) Applicant: QUALCOMM Incorporated, San Diego, CA (US)

(72) Inventors: Xia Li, San Diego, CA (US); Junjing Bao, San Diego, CA (US); John Jianhong Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 459 days.

(21) Appl. No.: 18/316,862

(22) Filed: May 12, 2023

(65) Prior Publication Data

US 2024/0379770 A1 Nov. 14, 2024

(51) Int. Cl.

| | |
|---|---|
| ***H10D 64/01*** | (2025.01) |
| ***H10D 30/62*** | (2025.01) |
| ***H10D 64/23*** | (2025.01) |
| ***H10D 84/83*** | (2025.01) |
| ***H10P 50/00*** | (2026.01) |
| *H10P 50/28* | (2026.01) |

(52) U.S. Cl.

CPC ......... *H10D 64/01* (2025.01); *H10D 30/6219* (2025.01); *H10D 64/258* (2025.01); *H10D 84/83* (2025.01); *H10D 84/834* (2025.01); *H10P 50/73* (2026.01); *H10P 50/282* (2026.01)

(58) Field of Classification Search

CPC .. H10D 64/01; H10D 30/6219; H10D 64/258; H10D 84/83; H10D 84/834; H10D 30/024; H10D 30/62; H01L 21/31144; H01L 21/31105; H01L 23/5226; H01L 21/76832; H01L 21/76834; H01L 21/76897

USPC ........................................................ 257/288

See application file for complete search history.

(56) References Cited

U.S. PATENT DOCUMENTS

| | | | | |
|---|---|---|---|---|
| 2016/0149016 | A1 | 5/2016 | Farmer et al. | |
| 2021/0384316 | A1 | 12/2021 | Yu et al. | |
| 2022/0293742 | A1 * | 9/2022 | Tsai | H10D 84/0158 |
| 2023/0044771 | A1 | 2/2023 | Ho et al. | |

OTHER PUBLICATIONS

International Search Report and Written Opinion—PCT/US2024/024594—ISA/EPO—Sep. 5, 2024.

* cited by examiner

*Primary Examiner* — Theresa T Doan

(74) *Attorney, Agent, or Firm* — Muncy, Geissler, Olds & Lowe, P.C.

(57) ABSTRACT

A self-aligned contact (SAC) and method for making the same is disclosed. In an aspect a field effect transistor (FET) structure comprises a channel connecting a first source or drain (S/D) region to a second S/D region, a gate structure, comprising a multi-layer metal gate between gate spacers, disposed above a gate region that at least partially surrounds the channel, a self-alignment structure, also referred to as a "hat", disposed above the gate structure and covering at least the multi-layer metal gate and the gate spacers, and a first S/D contact that is self-aligned to the hat and connected to the first S/D region. During fabrication, a self-assembly monolayer (SAM) is used to precisely align the hat over the multi-layer metal gate. The S/D contacts are then self-aligned to the hat, even if the etch mask has an overlay error. The hat also shields the gate structure during an etch.

25 Claims, 17 Drawing Sheets

SELF-ALIGNED CONTACT STRUCTURES AND METHODS FOR MAKING THE SAME

BACKGROUND OF THE DISCLOSURE

1. Field of the Disclosure

This disclosure relates generally to semiconductor wafer process, and more specifically to self-aligned contact structures and methods for making the same.

2. Description of the Related Art

As semiconductor features sizes are reduced, traditional fabrication techniques may not be precise enough to avoid process errors due to feature misalignment. One example is the placement of source, drain, and gate contacts.

FIG. 1A illustrates a traditional contact structure. Upon an active substrate 100, one or more gate structures have been fabricated as gate metal 102 between gate spacers 104. A source/drain (S/D) contact 106 is created by etching a dielectric oxide layer 108 to reach the active substrate 100. A properly-aligned S/D contact 106 is set away from the gate spacers 104 by a design-rule-specified distance 110.

FIG. 1B illustrates a potential problem with the traditional contact structure. If the S/D contact 106 is not properly aligned, e.g., due to a misalignment of a photoresist mask, which results in the S/D contact 106 touching the gate spacers at point 112, which increases the parasitic capacitance between the source/drain and the gate. In severe cases, the S/D contact 106 may make electrical contact with the gate metal 102, resulting in a short between the two terminals.

FIG. 2A illustrates a traditional self-aligned contact (SAC). The active substrate 100, gate metal 102, and gate spacers 104 are substantially identical to their like-numbered elements in FIG. 1A and FIG. 1B, but each gate structure now also includes a hard mask 200 over the gate metal 102, and the S/D contact 202 fills the gap between the gate spacers 104, i.e., the S/D contact 202 is self-aligned over the gate structure.

FIG. 2B illustrates a potential problem with the traditional SAC. FIG. 2B shows the gate structure in more detail. In the example shown in FIG. 2B, the gate structure includes a high-K dielectric 206, which surrounds a work function metal (WFM) 208, which surrounds a tungsten plug 210. The etch step in preparation for depositing the S/D contact 202 removes some of the hard mask 200 and gate spacer 104. If too much of the hard mask 200 and gate space 104 is removed, this allows the self-aligned S/D contact 202 to include additional metal 204 that is closer to the gate metal (i.e., the WFM 208 and the tungsten plug 210). Because the self-aligned S/D contact 202 is closer to the gate metal, this increases the parasitic capacitance between the S/D and the gate. Depending on how robust the hard mask 200 is, this capacitance can increase by 10% or more.

FIGS. 2C-2E illustrate additional potential problems with the traditional SAC, related to an etch step performed in preparation for placement of a gate contact (GC) onto the gate metal 102. FIG. 2C shows the results of an ideal etch that produces the proper recess depth and leaves a flat top surface of the high-K dielectric 206, the WFM 208, and the tungsten plug 210. However, the actual etch result looks more like FIG. 2D, which shows "dishing" of the WFM 208 and tungsten plug 210, resulting in "horns" at the outer edge of the WFM 208 when viewed in cross-section. The presence of horns results in insufficient isolation against a gate-to-contact short, (e.g., due to the horn of the WFM 208 being too close to the S/D contact at location 212). Even worse, the depth of the dishing effect and the height of the horns can vary based on the width and length of the particular gate structure, resulting in resistance and capacitance values for gate WFM 208 that can vary from FET to FET. Additional etching to remove the horns may result in FIG. 2E, e.g., excessive etching can result in damage to the WFM 208 layer.

Thus, conventional contacts typically require precise alignment of process layers, and self-aligned contacts typically require precise control of process steps. Accordingly, there is a need for a better approach having none of the disadvantages described above.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a field effect transistor (FET) structure includes a channel connecting a first source or drain (S/D) region to a second S/D region; a gate structure, comprising a multi-layer metal gate between gate spacers, disposed above a gate region that at least partially surrounds the channel; a self-alignment structure disposed above the gate structure and covering at least the multi-layer metal gate and the gate spacers; and a first S/D contact that is self-aligned to the self-alignment structure and connected to the first S/D region.

In an aspect, a method for fabricating a FET includes providing a channel connecting a first S/D region to a second S/D region; providing a gate structure, comprising a multi-layer metal gate between gate spacers, disposed above a gate region that at least partially surrounds the channel and embedded within a first oxide or dielectric (O/D) layer; providing a self-alignment structure disposed above the gate structure, covering at least the multi-layer metal gate and the gate spacers, and embedded within a second O/D layer disposed over the first O/D layer; and providing a first S/D contact that is self-aligned to the self-alignment structure and connected to the first S/D region.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings, wherein like reference numbers represent like parts, which are presented solely for illustration and not limitation of the disclosure.

Figure 1A:
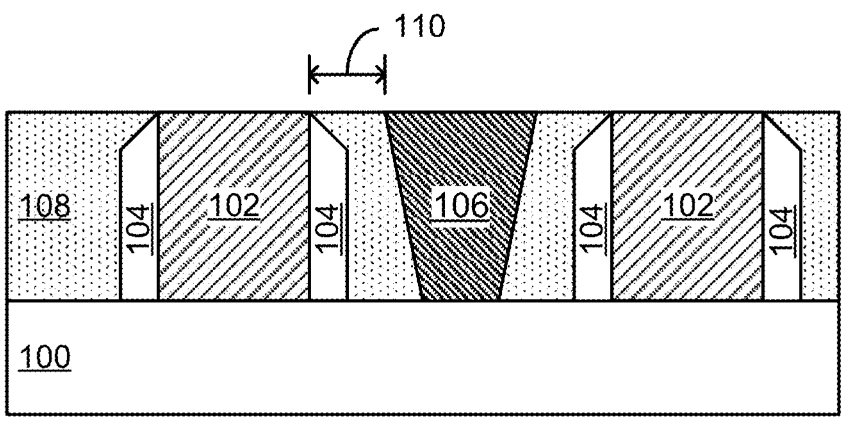
FIG. 1A illustrates a traditional contact structure.
Figure 1B:
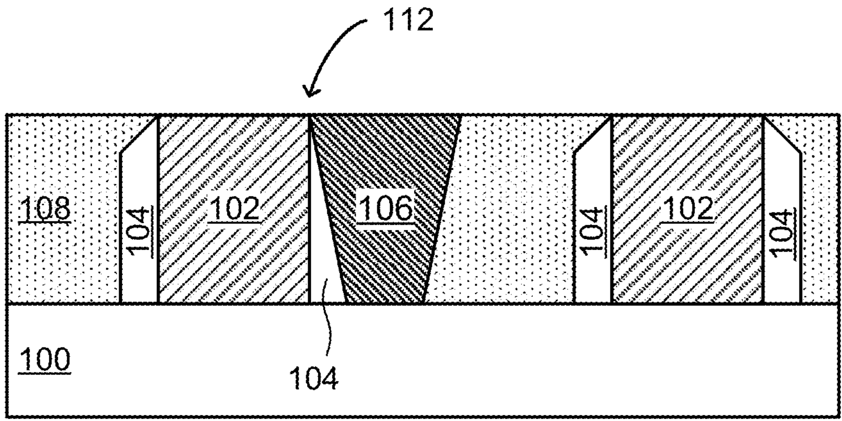
FIG. 1B illustrates a potential problem with the traditional contact structure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

A self-aligned contact (SAC) and methods for making the same is disclosed. In an aspect, a field effect transistor (FET) structure comprises a channel connecting a first source or drain (S/D) region to a second S/D region, a gate structure, comprising a multi-layer metal gate between gate spacers, disposed above a gate region that at least partially surrounds the channel, a self-alignment structure, also referred to as a "hat", disposed above the gate structure and covering at least the multi-layer metal gate and the gate spacers, and at least one S/D contact that is self-aligned to the hat and connected to a S/D region. During fabrication, a self-assembly monolayer (SAM) is used to precisely align the hat over the multi-layer metal gate. The S/D contacts are then self-aligned to the hat, even if the etch mask has an overlay error. The hat also shields the gate structure during an etch, which obviates the need for a hard mask over the gate metal and the accompanying hard mask etch step.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage, or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Figure 2A:
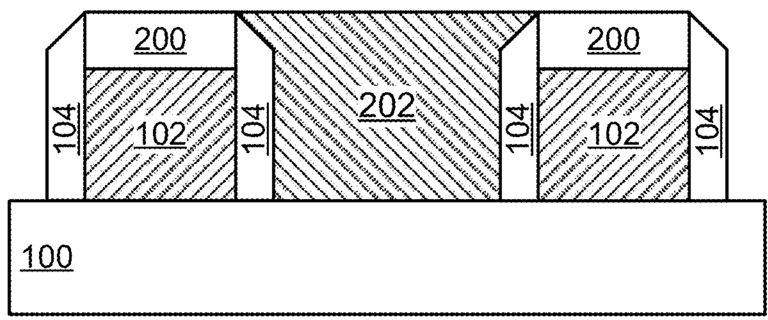
FIG. 2A illustrates a traditional self-aligned contact (SAC).
Figure 2B:
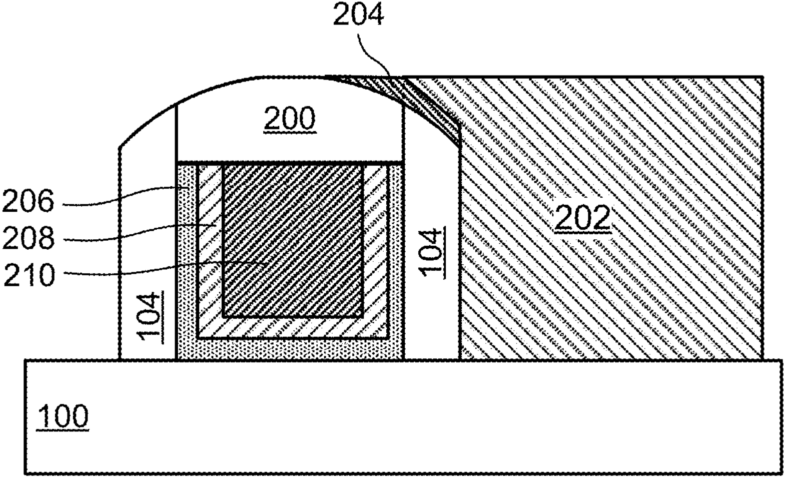
FIG. 2B illustrates a potential problem with the traditional SAC.
Figure 2C:
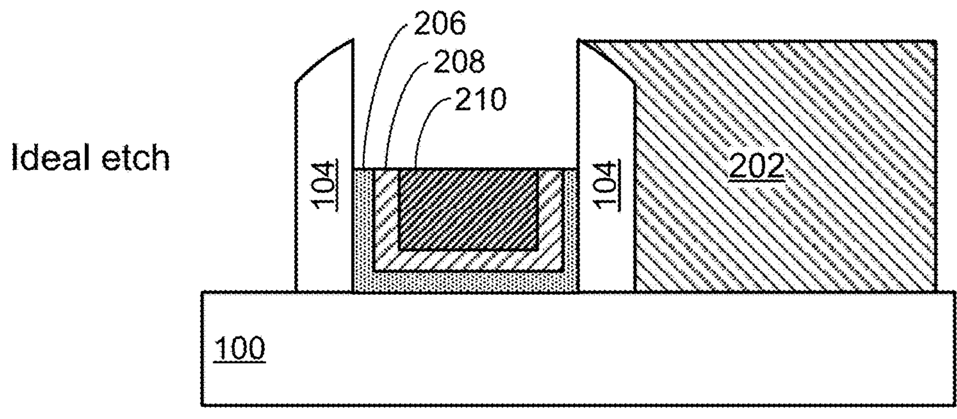
FIGS. 2C-2E illustrate additional potential problems with the traditional SAC.
Figure 2D:
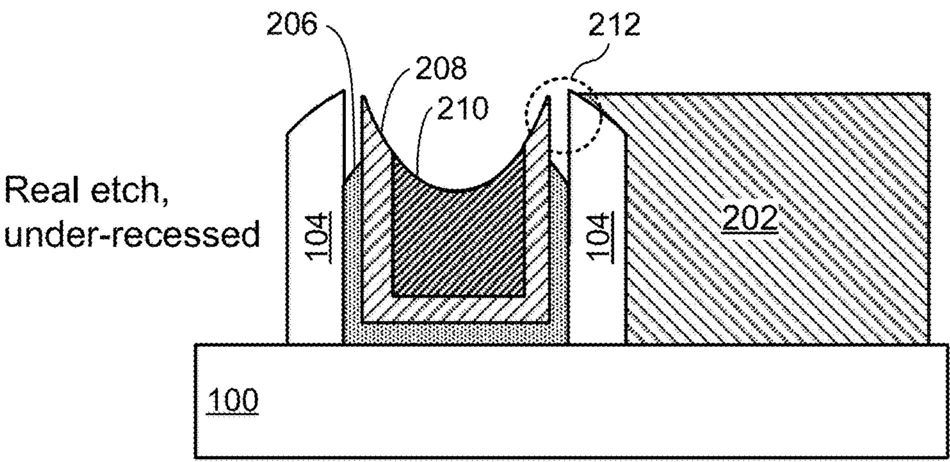
Figure 2E:
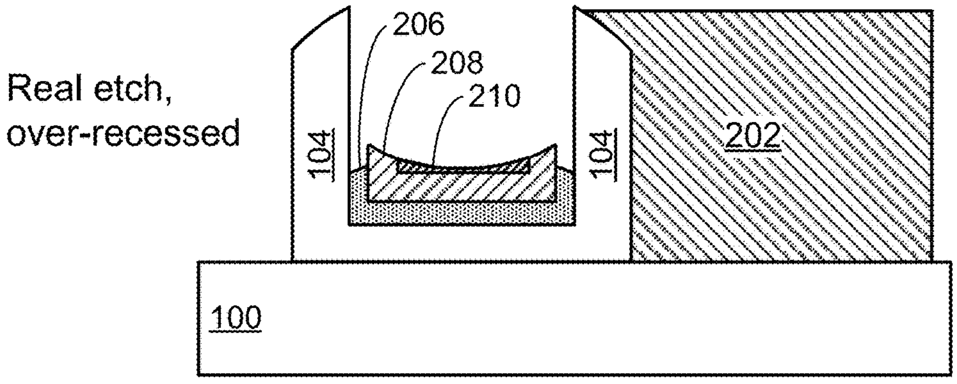
Figure 3A:
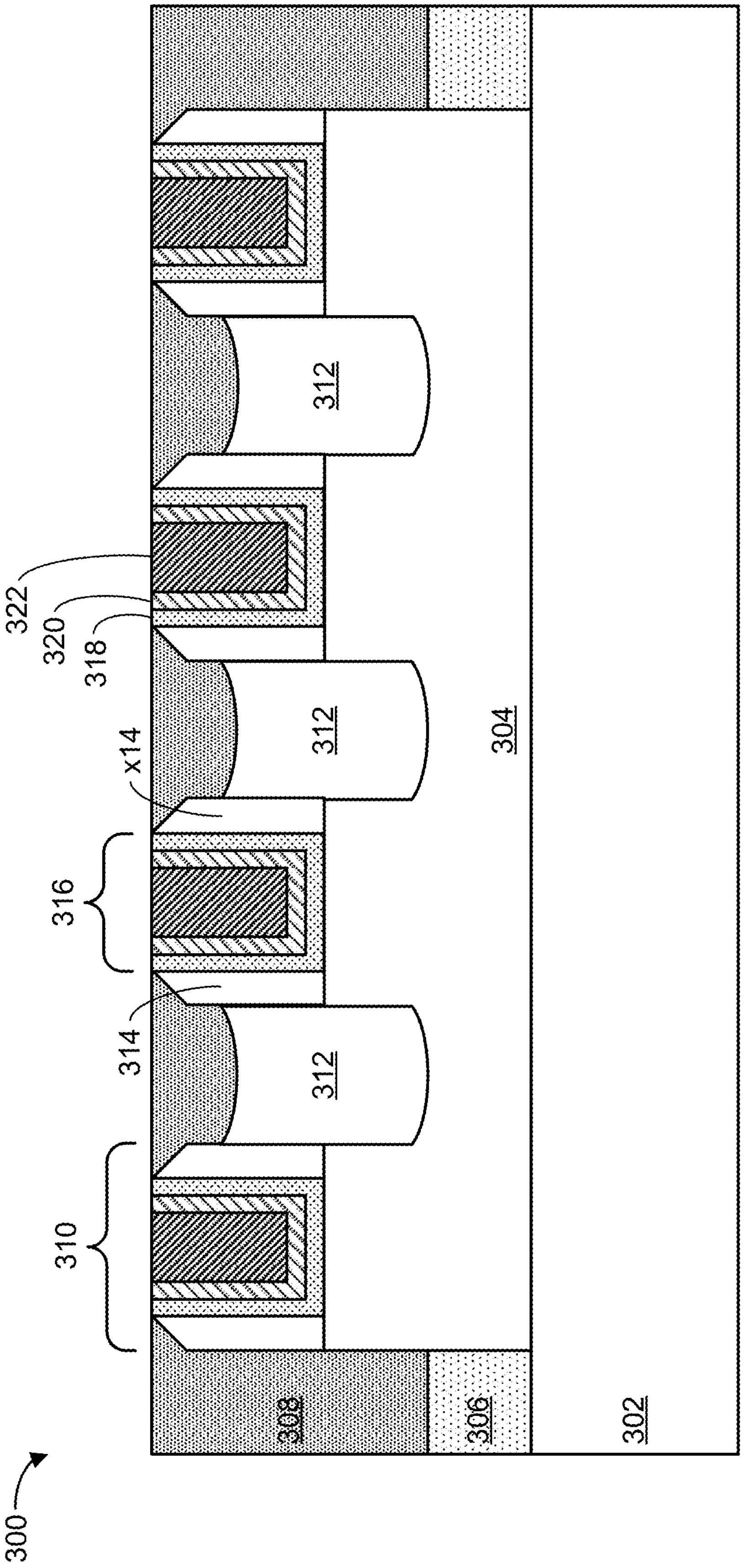
FIGS. 3A-3K are cross-sections that illustrate steps in a process for fabricating self-aligned contact structures according to aspects of the disclosure.

FIGS. 3A-3K are cross-sections that illustrate steps in a process for fabricating self-aligned contact structures according to aspects of the disclosure. As shown in FIG. 3A, the process starts with a structure 300 comprising a substrate 302 upon which a finFET 304 has been constructed, e.g., using a replacement metal gate (RMG) process. The finFET 304 is surrounded by a shallow trench isolation (STI) layer 306 and covered by an inter-layer dielectric (ILD) layer 308. Gate structures 310 are separated by epitaxial (EPI) source/drain (S/D) regions 312. In the example shown in FIGS. 3A-3K, each gate structure 310 includes a set of gate spacers 314, between which is a metal gate (MG) structure 316. In the example shown in FIG. 3A, the MG structure 316 comprises a high-K dielectric 318, which surrounds a work function metal (WFM) 320 (e.g., titanium nitride or tantalum nitride), which surrounds a tungsten plug 322, but other replacement metal gate (RMG) structures may also be used. Notably, unlike the conventional SAC shown in FIG. 2A, the gate structure 310 in FIG. 3A does not include a hard mask between the gate spacers 314 that must be later etched to expose the MG structure 316. FIG. 3A shows an example cross-section after a chemical/mechanical polishing (CMP) step.

Figure 3B:
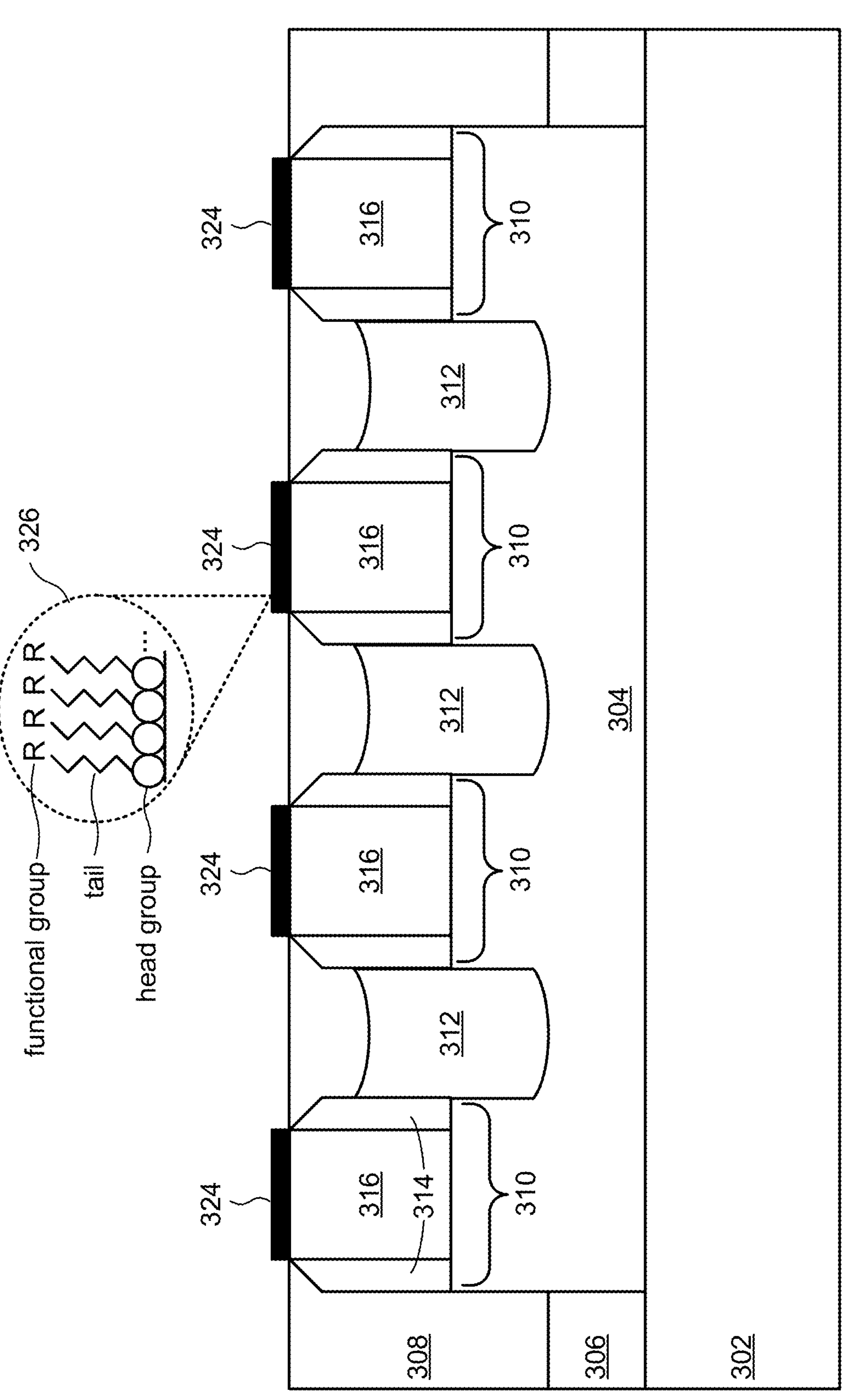

FIG. 3B shows the result of forming a self-assembly monolayer (SAM) 324 on the MG structure 316 portion of the gate structure 310. As shown in the magnified view 326, a SAM is a repeated series of molecules having a head group, shown as a circle, a long tail, and a functional group that is represented by the letter "R". The head group formed by selective growth by chemisorption (e.g., sulfur to metallic contacts). The long tail may comprise alkanethiols with a $(C—C)^n$ chain. The functional group R provides a chemical inhibition to atomic layer deposition (ALD). The SAM 324 may be deposited by electroless deposition (ELD) or physical vapor deposition (PVD). The SAM 324 is later removed, e.g., via H2/N2 ash or thermal desorption. In the example shown in FIG. 3B, the SAM 324 is deposited onto to the MG structure 316 but not onto the ILD layer 308.

Figure 3C:
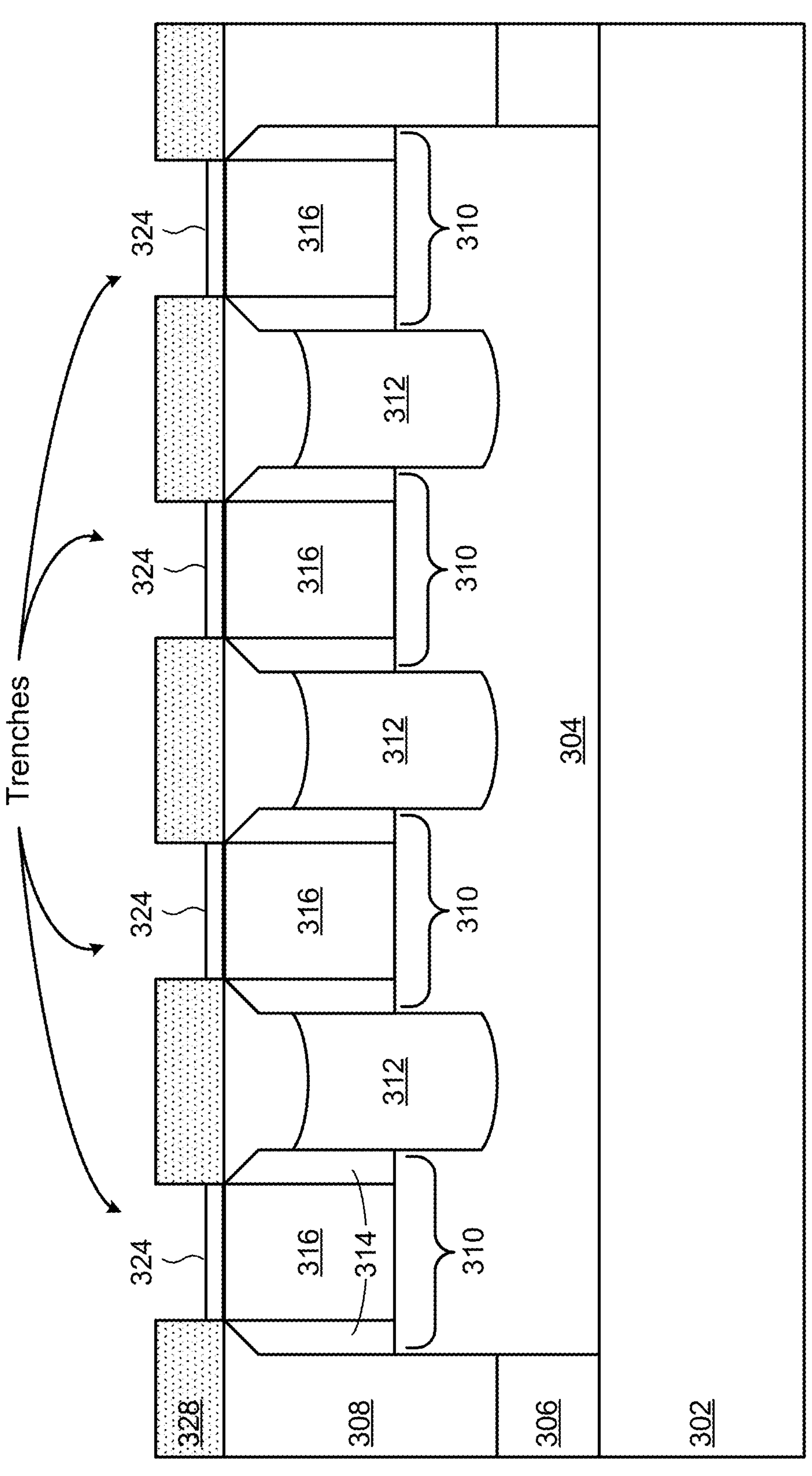

FIG. 3C shows the result after deposition of layer 328, e.g., after selective ALD of $AlO_X$ or another dielectric in some aspects or after deposition of $SiO_2$ or another oxide in other aspects. The selective deposition of layer 328 around the SAM 324 forms trenches on top of the MG structures 316.

Figure 3D:
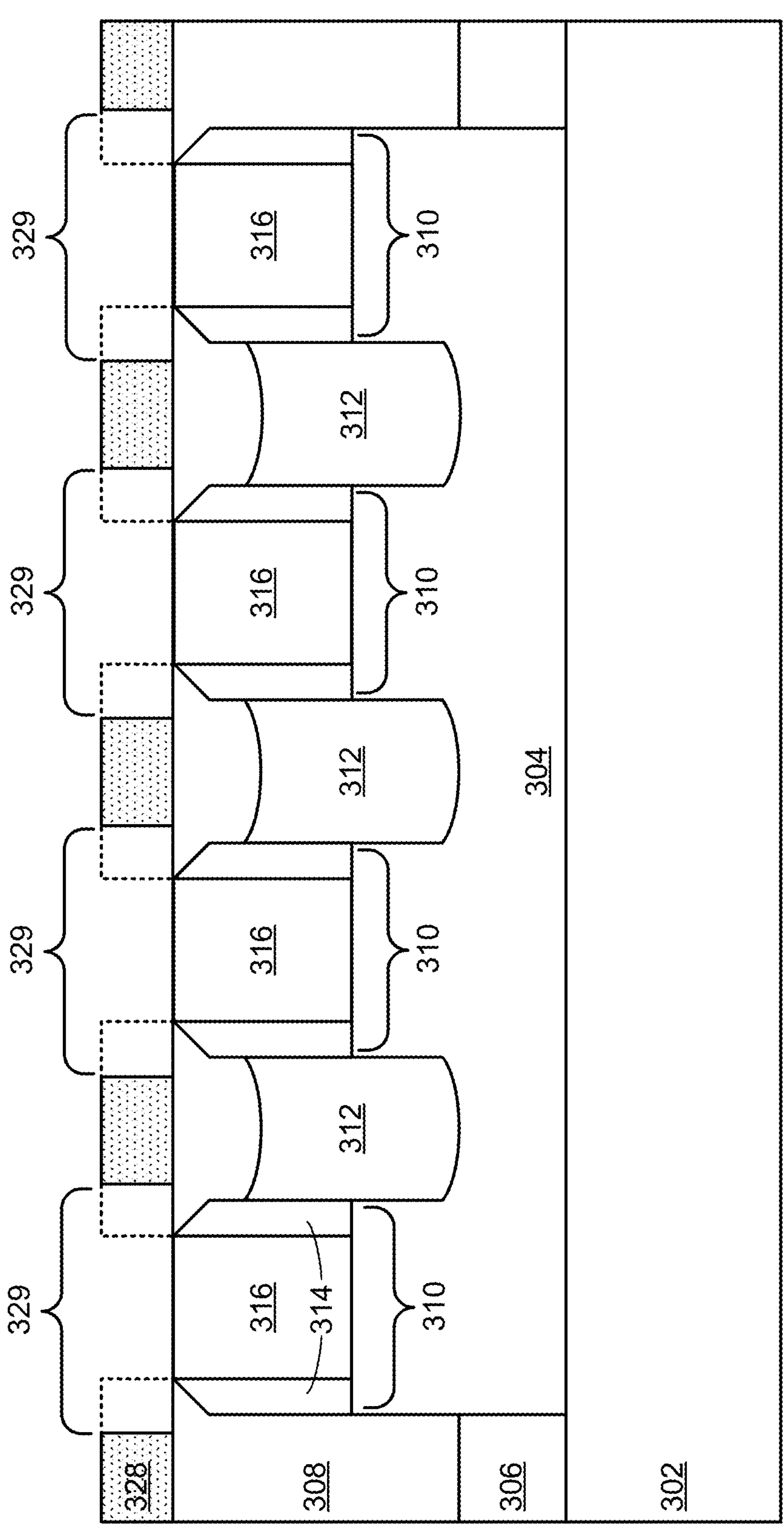

FIG. 3D shows the result after the SAM 324 is removed (e.g., using $H_2/N_2$ ash or thermal desorption) and after the layer 328 is trimmed such that the trenches 329 are enlarged (the dashed lines indicate the removed portions). In some aspects, the layer 328 is trimmed using an etching process, such as an anti-isotropic AlOx film etch, which in general has a higher etch rate in the horizontal sidewall direction than in the vertical direction. The use of the SAM 324 avoids any overlay error that might occur with a traditional photolithography process, because the SAM 324 bonds only to the MG structures 316 and is thus a self-aligned process.

Figure 3E:
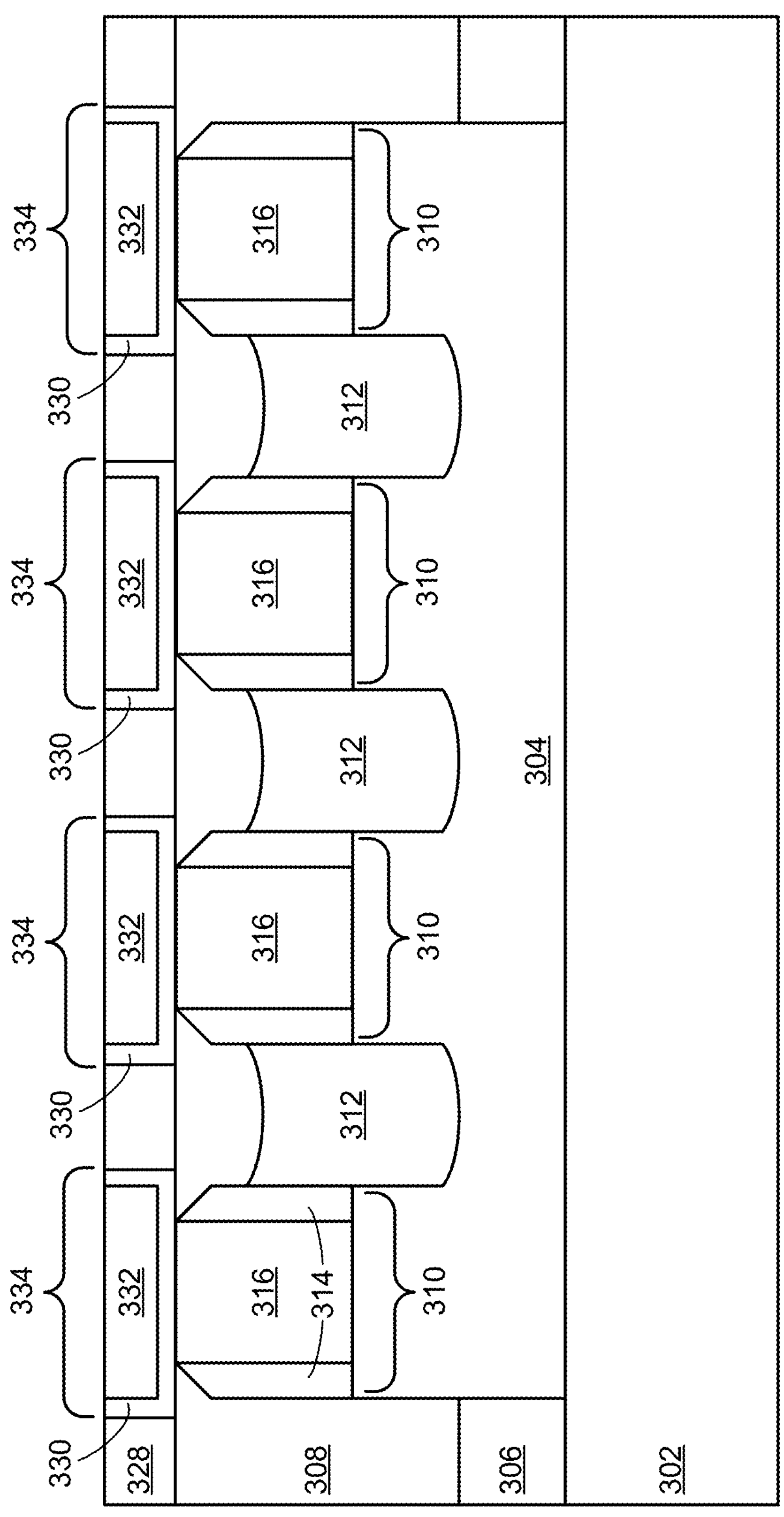

FIG. 3E shows the result after deposition of a bi-layer film comprising a first layer 330 and a second layer 332 and another CMP step. The bi-layer film reduces parasitic capacitance. Example bi-layer films include, but are not limited to, SiN over $SiO_2$, AlN over SiN, and SiC over SiN. The structure comprising the first layer 330 and the second 332 together is referred to herein as a self-alignment structure 334. The self-alignment structure 334 is self-aligned with, and in some aspects extends over, the gate structure 310. In some aspects, the sides of the self-alignment structure 334 horizontally extend to the outside edge of the gate spacers 314. In some aspects, such as the example shown in FIG. 3E, the sides of the self-alignment structure 334 extend slightly beyond the outside edge of the gate spacers 314 and slightly overhang the EPI S/D regions 312. The self-alignment structures 334 will not only constrain the eventual positions of S/D contacts but will also protect the top surfaces of the gate structures 310, and for this reason the self-alignment structure 334 may also be referred to herein as a "hat" 334.

Figure 3F:
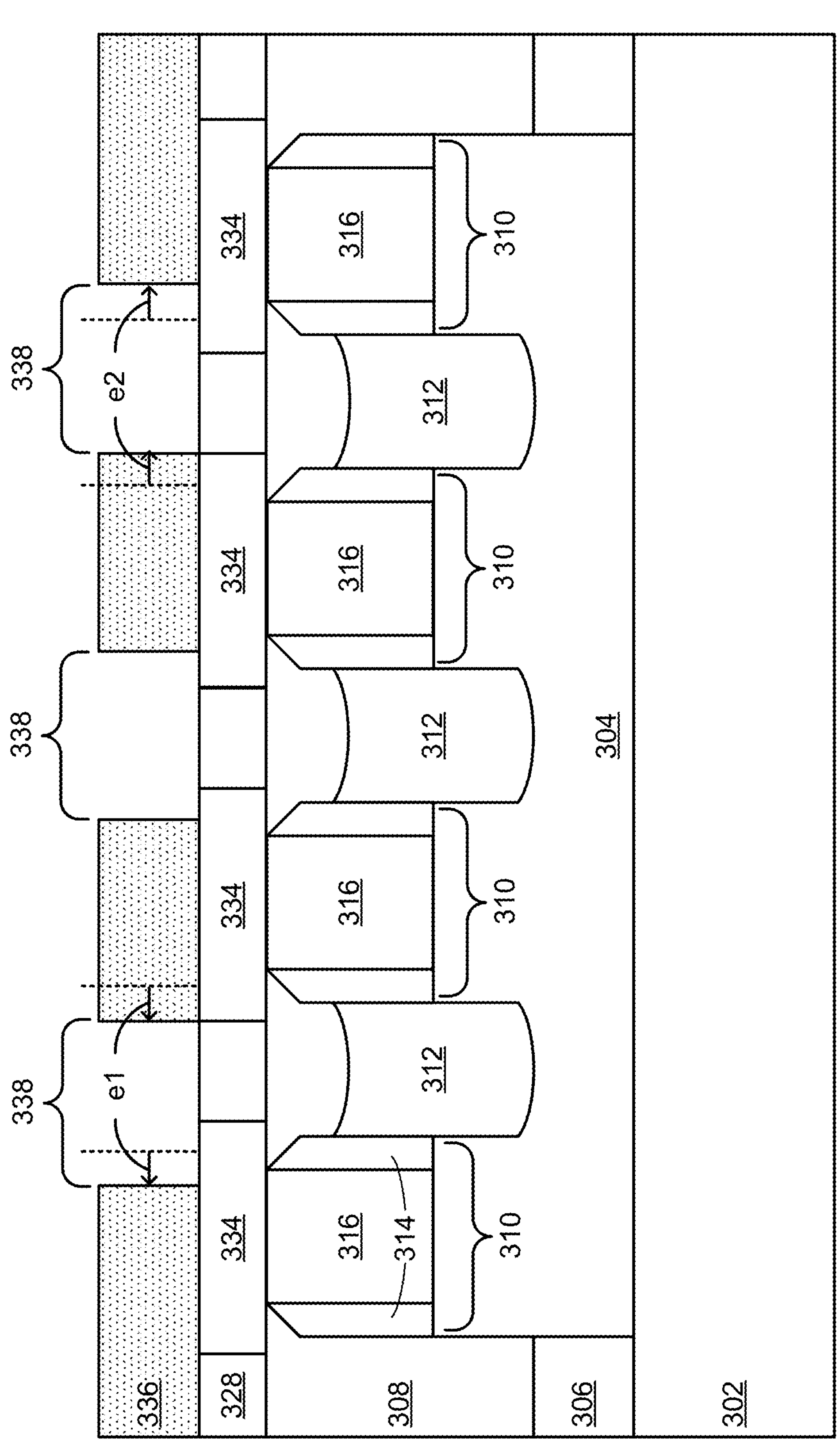

FIG. 3F shows the result after deposition of a metal drain (MD) photoresist (PR) layer 336 having holes 338 in preparation for etching through layer 328 and ILD layer 308 to expose the S/D regions 312. In the ideal case, all holes 338 are centered over the S/D regions 312, but an overlay shift left or overlay shift right can cause the holes 338 to not be perfectly aligned over their respective S/D regions 312. An example of this is shown in FIG. 3F, where the center hole 338 is aligned over the S/D regions 312 below (e.g., representing the ideal case), but the left and right holes 338 are not aligned over their respective S/D regions 312 (e.g., representing an overlay left shift or right shift case), but instead have some offset error, shown as e1 and e2 in FIG. 3F. These offset errors are not desired but are shown in this example for illustrative purposes only.

Figure 3G:
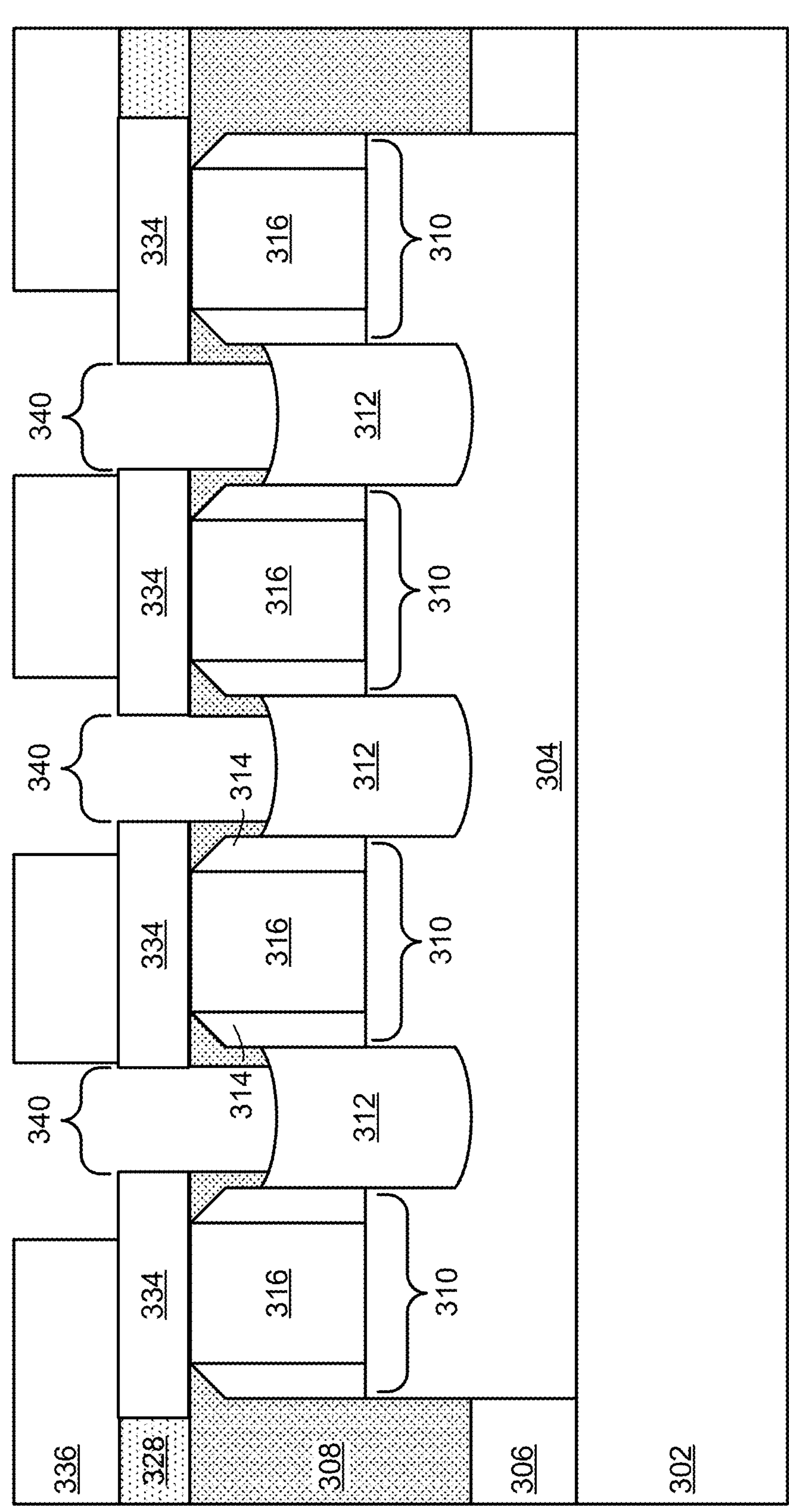

FIG. 3G shows the result after an etching step in preparation for MD deposition: contact holes or trenches 340 expose the S/D regions 312. It is noted that, despite the fact that some holes 338 in the MDPR layer 336 were not perfectly aligned over their respective S/D regions 312, the hats 334 acted as additional etching masks to cause the contact holes or trenches 340 to be self-aligned over the S/D regions 312 below. Moreover, the presence of the hats 334 protected the top of the gate structures 310 (e.g., gate spacers 314 and the MG structure 316) from being eroded during the etch step. Such erosion of even the gate spacers 314 would have allowed the later-deposited contact metal to be close enough to the MG structure 316 to increase parasitic capacitance between the gate and drain contacts.

Figure 3H:
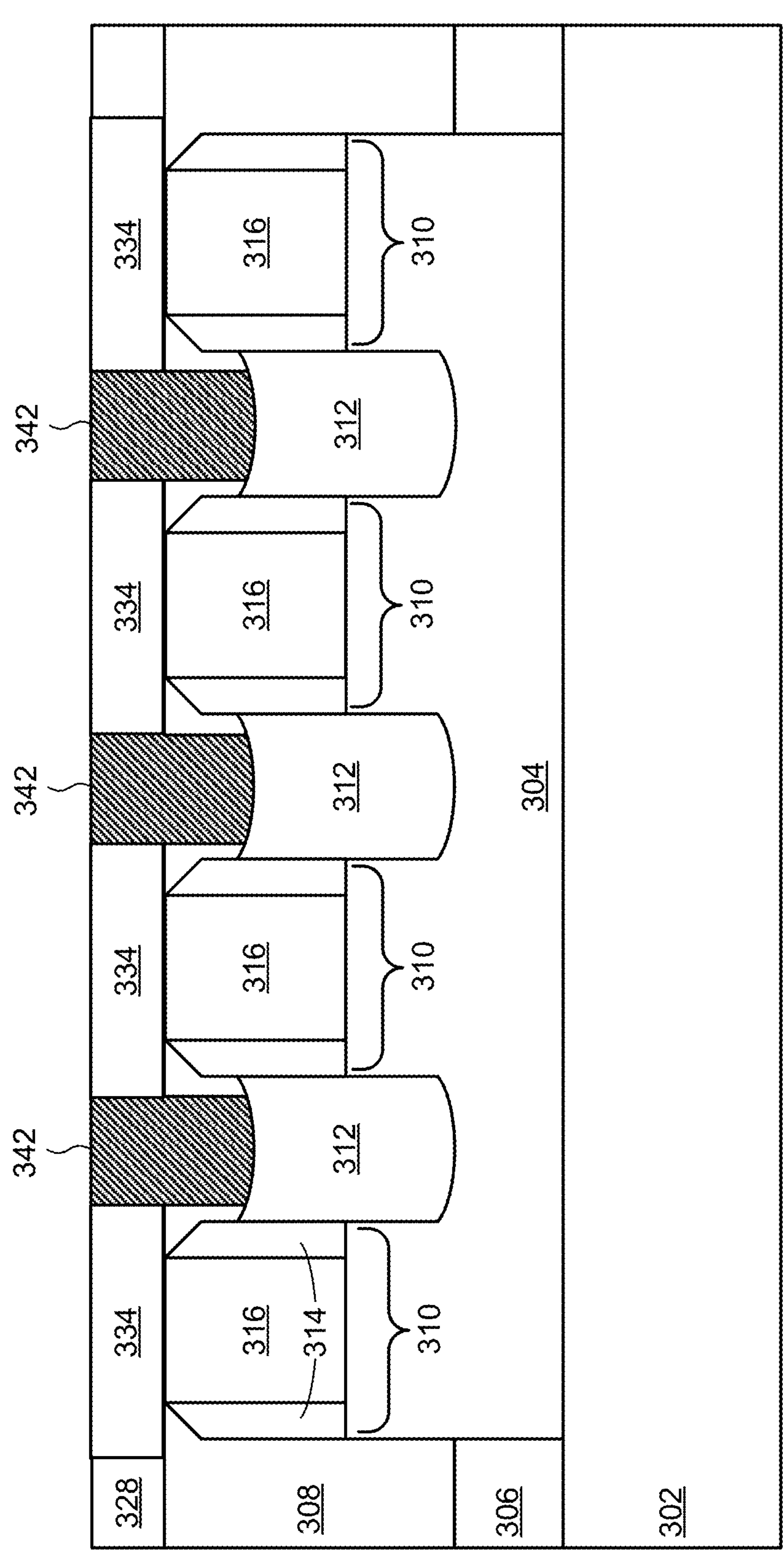

FIG. 3H shows the result after removal of the MDPR layer 328, deposition of contact metal 342, and another CMP step. In some aspects, deposition of the contact metal 342 includes ALD of a TaN liner and cobalt or Molybdenum or tungsten metal.

Figure 3I:
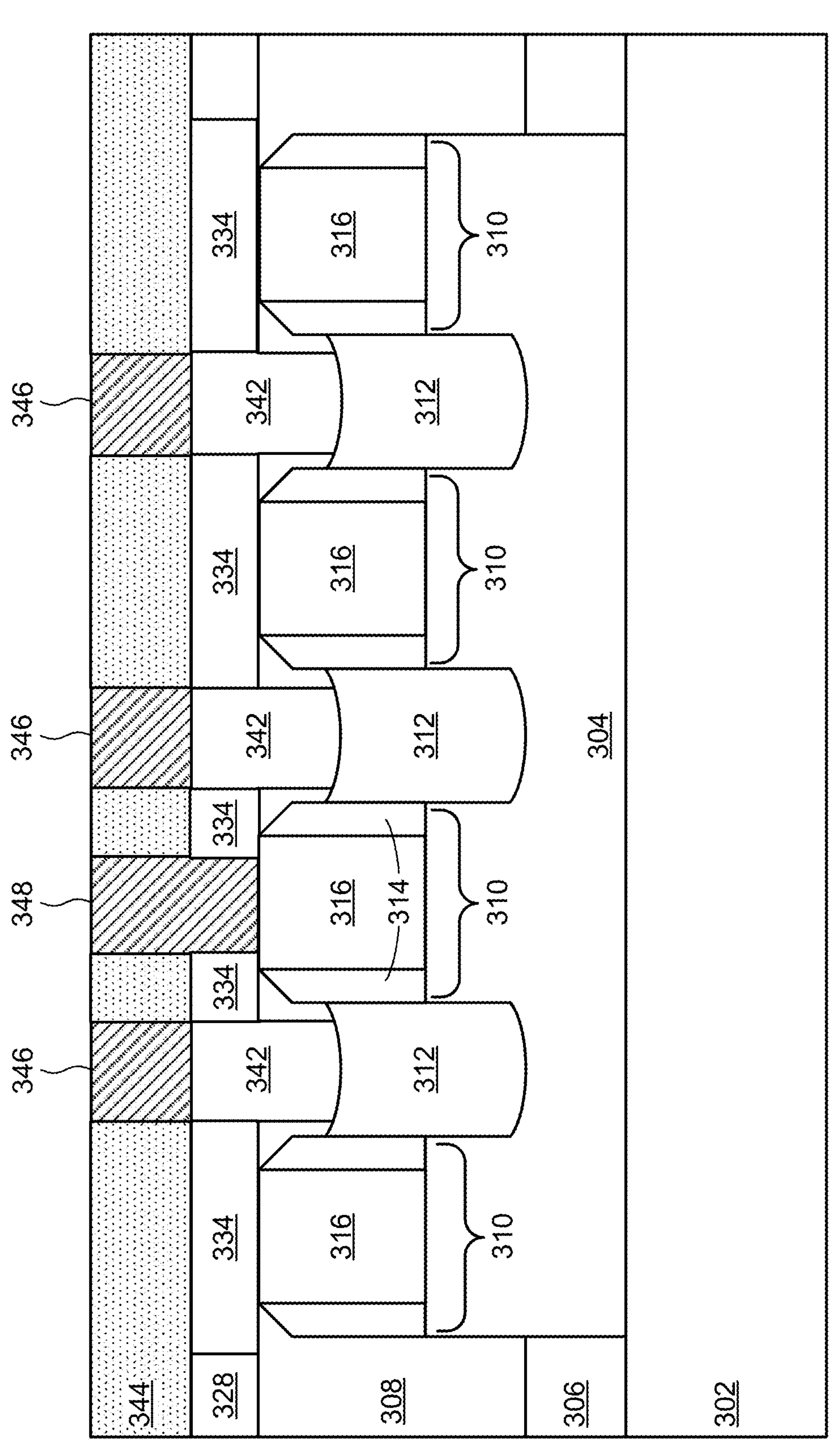

FIG. 3I shows the result after deposition of an ILD layer 344, a photolithography process to etch the ILD layer 344 and one or more hats 334, and a process to produce S/D vias 346 and a gate via 348. It is noted that the gate via 348 makes contact with a gate structure 310 that did not have a hard mask between the gate spacers 314 and thus did not need an etch step to create a recess through the hard mask. In some aspects, the S/D vias 346 and gate vias 348 are produced by selective growth of tungsten followed by another CMP process. In some aspects, the ILD layer 344 may comprise an oxide ILD layer. In some aspects, the ILD layer 344 may comprise a dielectric layer. In some aspects, the ILD layer 344 may comprise an oxide layer disposed above a dielectric layer that provides additional self-alignment of the vias.

Figure 3J:
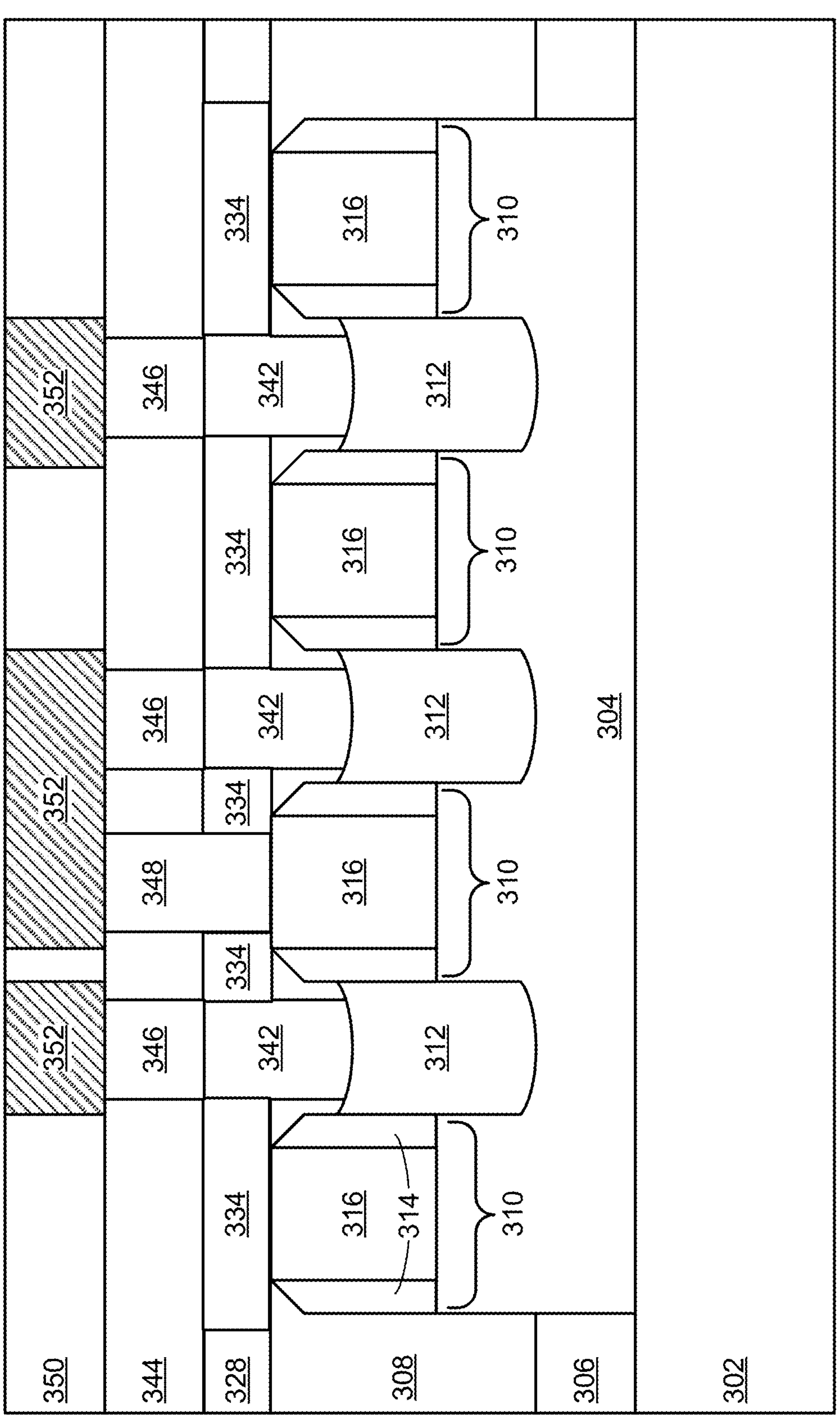

FIG. 3J shows the result after deposition of an oxide IMD layer 350 and a process to deposit a metal layer 352. In some aspects, metal layer 352 may comprise copper from a single damascene process. As shown in FIG. 3J, the use of hats 334 resulted in self-aligned S/D contacts 342 that do not encroach on the gate structures 310, and gate contacts that do not require a hard cap into which a recess must be later precisely etched-thus overcoming the weaknesses of conventional contacts and SACs.

The techniques illustrated in FIGS. 3A-3J may be applied to many different transistor architectures, including, but not limited to, planar FETs, finFETs, and gate-all-around (GAA) FET designs.

Figure 3K:
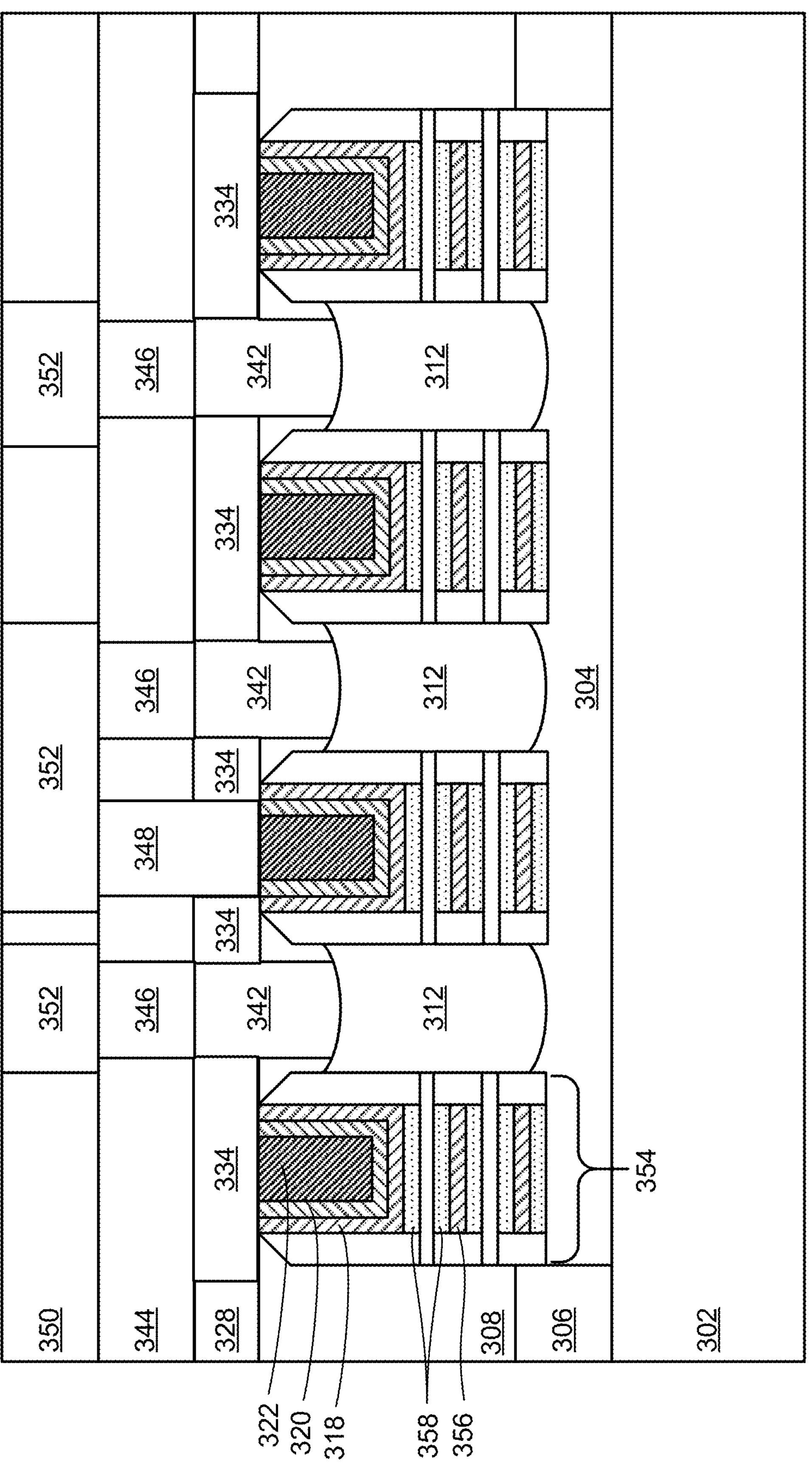

FIG. 3K is a cross-section showing the result of fabricating a GAA FET 354 using a process for fabricating self-aligned contact structures according to aspects of the disclosure. The GAA FET 354 has multiple channels 356 separated from the gate by dielectric material or oxides 358.

It will be appreciated that the foregoing fabrication process was provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 4:
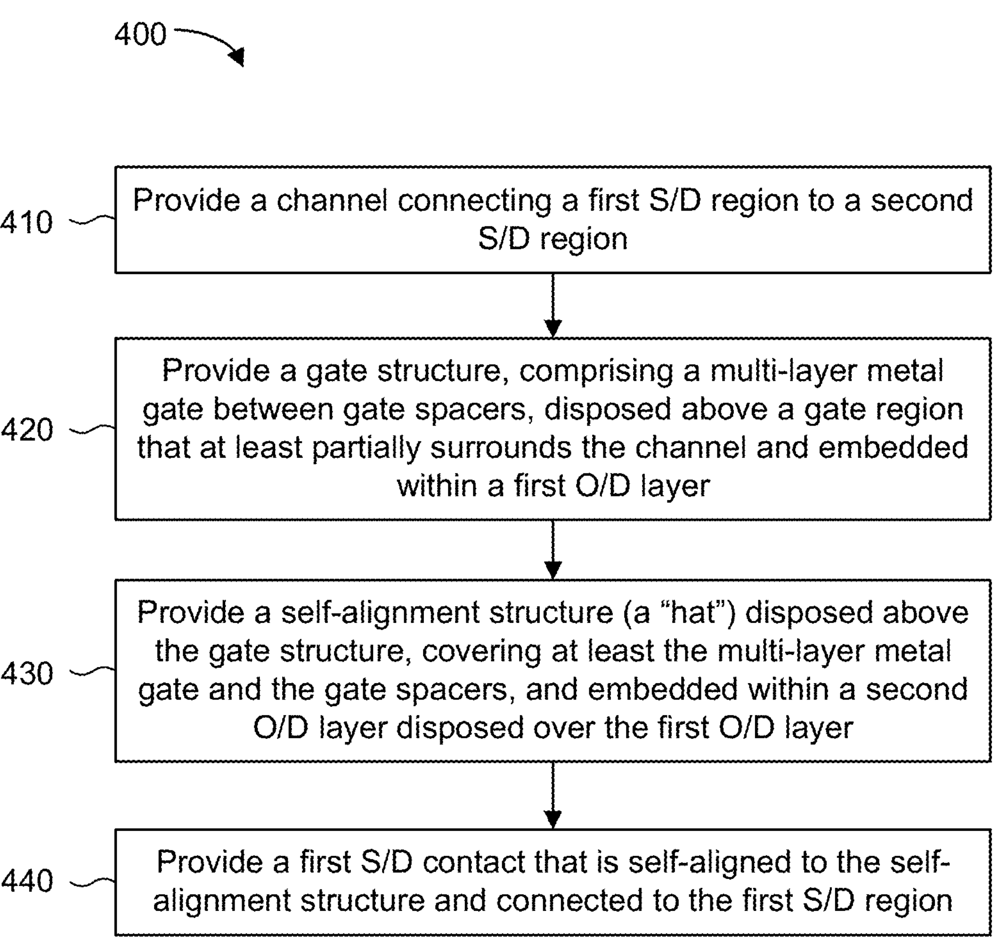
FIG. 4 is a flowchart of an example process associated with fabricating a FET, according to aspects of the disclosure.

FIG. 4 is a flowchart of an example process 400 associated with fabricating a FET, according to aspects of the disclosure. In some aspects, the FET comprises a planar FET, a finFET, or a gate-all-around (GAA) FET.

As shown in FIG. 4, process 400 may include, at block 410, providing a channel connecting a first source or drain (S/D) region to a second S/D region. In some aspects, at least one of the first S/D region or the second S/D region comprises an epitaxial layer.

As further shown in FIG. 4, process 400 may include, at block 420, providing a gate structure, comprising a multi-layer metal gate between gate spacers, disposed above a gate region that at least partially surrounds the channel and embedded within a first oxide or dielectric (O/D) layer. In some aspects, the multi-layer metal gate structure comprises a high-K dielectric layer at least partially surrounding a work function metal layer.

As further shown in FIG. 4, process 400 may include, at block 430, providing a self-alignment structure disposed above the gate structure, covering at least the multi-layer metal gate and the gate spacers, and embedded within a second O/D layer disposed over the first O/D layer. In some aspects, providing the self-alignment structure disposed above the gate structure, covering at least the multi-layer metal gate and the gate spacers, and embedded within the second O/D layer comprises forming a self-assembly monolayer (SAM) layer on a top portion of the multi-layer metal gate, selectively depositing the second O/D layer above the first O/D layer but not above the multi-layer metal gate, forming gate trenches within the second O/D layer, removing the SAM layer from the gate trenches, and forming the self-alignment structure within the gate trenches. In some aspects, forming the self-alignment structure within the gate trenches comprises forming a bi-layer film within the gate trenches. In some aspects, forming the bi-layer film comprises disposing a first layer within the gate trenches, the first layer comprising silicon nitride (SiN) or silicon dioxide ($SiO2$), and disposing a second layer above the first layer, the second layer comprising aluminum nitride (AlN) or silicon carbide (SiC).

As further shown in FIG. 4, process 400 may include, at block 440, providing a first S/D contact that is self-aligned to the self-alignment structure and connected to the first S/D region. In some aspects, providing the first S/D contact that is self-aligned to the self-alignment structure and connected to the first S/D region comprises etching the second O/D layer above the first S/D region to create a trench with sides delimited by an outside edge of the self-alignment structure, and depositing S/D contact material into the trench.

In some aspects, process 400 further includes providing a second S/D contact that is self-aligned to the self-alignment structure and connected to the second S/D region.

In some aspects, process 400 further includes providing a gate contact that is connected to the multi-layer metal gate through a hole etched through the self-alignment structure.

In some aspects, process 400 further includes providing a third O/D layer disposed above the second O/D layer.

In some aspects, process 400 includes further providing at least one of a S/D via connected to the first S/D contact through the third O/D layer, or a gate contact that is connected to the multi-layer metal gate through the self-alignment structure, and a gate via connected to the gate contact through the third O/D layer. In some aspects, providing the third O/D layer comprises providing an upper oxide layer and a lower dielectric layer.

Process 400 may include additional implementations, such as any single implementation or any combination of implementations described below and/or in connection with one or more other processes described elsewhere herein. Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
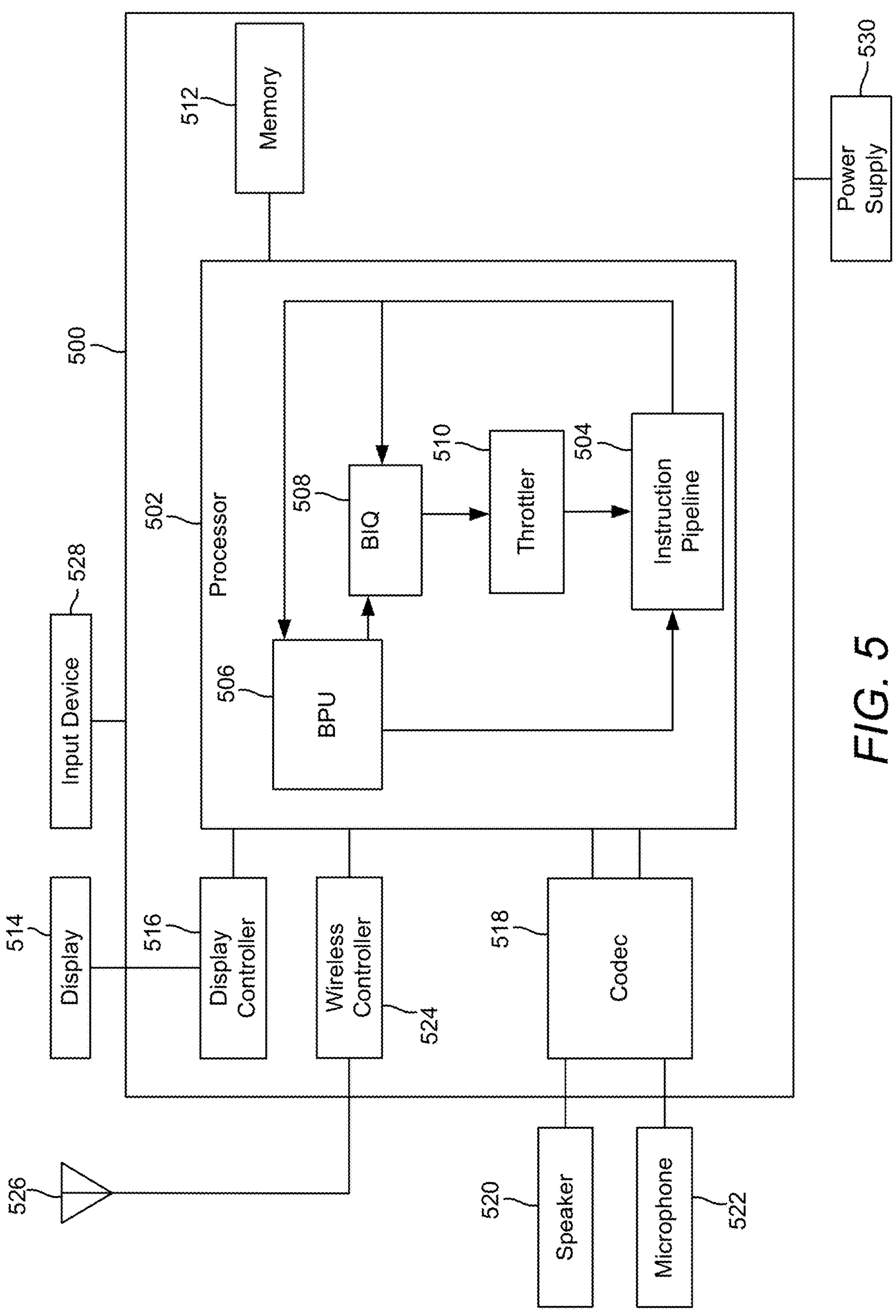
FIG. 5 illustrates an exemplary mobile device in accordance with some examples of the disclosure.

FIG. 5 illustrates an exemplary mobile device in accordance with some examples of the disclosure. Referring now to FIG. 5, a block diagram of a mobile device that is configured according to exemplary aspects is depicted and generally designated mobile device 500. In some aspects, mobile device 500 may be configured as a wireless communication device. As shown, mobile device 500 includes processor 502. Processor 502 is shown to comprise instruction pipeline 504, buffer processing unit (BPU) 506, branch instruction queue (BIQ) 508, and throttler 510 as is well known in the art. Other well-known details (e.g., counters, entries, confidence fields, weighted sum, comparator, etc.) of these blocks have been omitted from this view of processor 502 for the sake of clarity. Processor 502 may be communicatively coupled to memory 512 over a link, which may be a die-to-die or chip-to-chip link. Mobile device 500 also includes display 514 and display controller 516, with display controller 516 coupled to processor 502 and to display 514.

In some aspects, FIG. 5 may include coder/decoder (CODEC) 518 (e.g., an audio and/or voice CODEC) coupled to processor 502; speaker 520 and microphone 522 coupled to CODEC 518; and wireless controller circuits 524 (which may include a modem, radio frequency (RF) circuitry, filters, etc., which may be implemented using one or more flip-chip devices, as disclosed herein) coupled to wireless antenna 526 and to processor 502.

In a particular aspect, where one or more of the above-mentioned blocks are present, processor 502, display controller 516, memory 512, CODEC 518, and wireless controller circuits 524 can be included in a system-in-package or system-on-chip device, which may be implemented in whole or part using the techniques disclosed herein. Input device 528 (e.g., physical or virtual keyboard), power supply 530 (e.g., battery), display 514, input device 528, speaker 520, microphone 522, wireless antenna 526, and power supply 530 may be external to the system-on-chip device and may be coupled to a component of the system-on-chip device, such as an interface or a controller.

It should be noted that although FIG. 5 depicts a mobile device, the processor 502 and memory 512 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
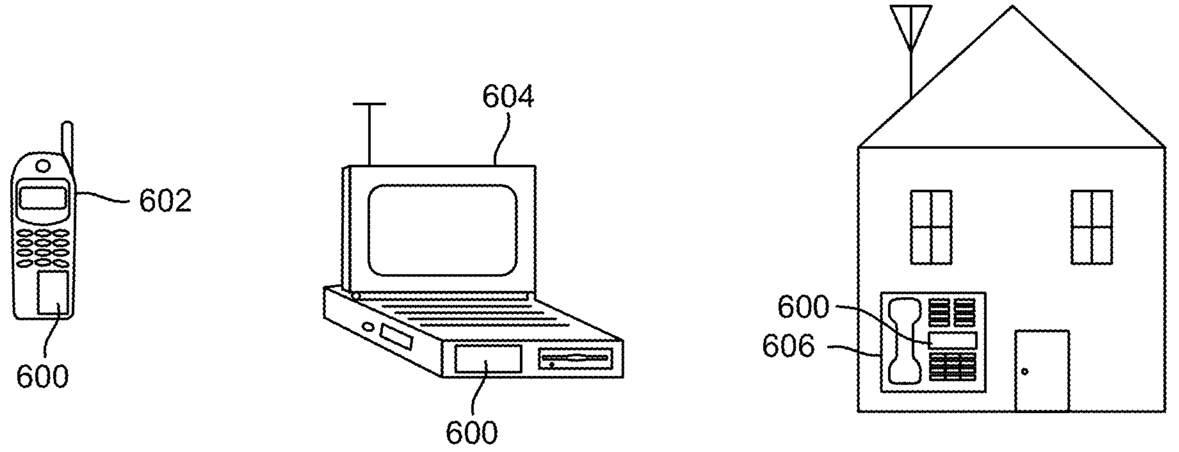
FIG. 6 illustrates various electronic devices that may be integrated with any of the aforementioned integrated device or semiconductor device in accordance with various examples of the disclosure.

FIG. 6 illustrates various electronic devices that may be integrated with any of the aforementioned integrated device or semiconductor device in accordance with various examples of the disclosure. For example, a mobile phone device 602, a laptop computer device 604, and a fixed location terminal device 606 may each be considered generally user equipment (UE) and may include a device 600 as described herein, for example. The device may be, for example, any of the integrated circuits, dies, integrated devices, integrated device packages, integrated circuit devices, device packages, integrated circuit (IC) packages, package-on-package devices described herein. The mobile phone device 602, laptop computer device 604, and fixed location terminal device 606 illustrated in FIG. 6 are merely exemplary. Other electronic devices may also feature device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A field effect transistor (FET) structure, comprising: a channel connecting a first source or drain (S/D) region to a second S/D region; a gate structure, comprising a multi-layer metal gate between gate spacers, disposed above a gate region that at least partially surrounds the channel; a self-alignment structure disposed above the gate structure and covering at least the multi-layer metal gate and the gate spacers; and a first S/D contact that is self-aligned to the self-alignment structure and connected to the first S/D region.

Clause 2. The FET structure of clause 1, further comprising a second S/D contact that is self-aligned to the self-alignment structure and connected to the second S/D region.

Clause 3. The FET structure of any of clauses 1 to 2, further comprising a gate contact that is connected to the multi-layer metal gate through the self-alignment structure.

Clause 4. The FET structure of any of clauses 1 to 3, wherein at least one of the first S/D region and the second S/D region comprises an epitaxial layer.

Clause 5. The FET structure of any of clauses 1 to 4, wherein the multi-layer metal gate comprises a high-K dielectric layer at least partially surrounding a work function metal layer.

Clause 6. The FET structure of any of clauses 1 to 5, wherein the self-alignment structure comprises a bi-layer film.

Clause 7. The FET structure of clause 6, wherein the bi-layer film comprises: silicon nitride (SiN) disposed over silicon dioxide (SiO2); aluminum nitride (AlN) disposed over SiN; or silicon carbide (SiC) disposed over SiN.

Clause 8. The FET structure of any of clauses 1 to 7 at least partially surrounded by a shallow trench isolation (STI) layer.

Clause 9. The FET structure of any of clauses 1 to 8, wherein the gate structure is embedded within a first oxide or dielectric (O/D) layer.

Clause 10. The FET structure of clause 9, wherein the self-alignment structure is embedded within a second O/D layer disposed above the first O/D layer.

Clause 11. The FET structure of clause 10, further comprising a third O/D layer disposed above the second O/D layer.

Clause 12. The FET structure of clause 11, further comprising at least one of: a S/D via connected to the first S/D contact through the third O/D layer; or a gate contact that is connected to the multi-layer metal gate through the self-alignment structure, and a gate via connected to the gate contact through the third O/D layer.

Clause 13. The FET structure of any of clauses 1 to 12, comprising a planar FET, a finFET, or a gate-all-around (GAA) FET.

Clause 14. A method for fabricating a field effect transistor (FET), the method comprising: providing a channel connecting a first source or drain (S/D) region to a second S/D region; providing a gate structure, comprising a multi-layer metal gate between gate spacers, disposed above a gate region that at least partially surrounds the channel and embedded within a first oxide or dielectric (O/D) layer; providing a self-alignment structure disposed above the gate structure, covering at least the multi-layer metal gate and the gate spacers, and embedded within a second O/D layer disposed over the first O/D layer; and providing a first S/D contact that is self-aligned to the self-alignment structure and connected to the first S/D region.

Clause 15. The method of clause 14, wherein at least one of the first S/D region or the second S/D region comprises an epitaxial layer.

Clause 16. The method of any of clauses 14 to 15, wherein the multi-layer metal gate structure comprises a high-K dielectric layer at least partially surrounding a work function metal layer.

Clause 17. The method of any of clauses 14 to 16, wherein providing the self-alignment structure disposed above the gate structure, covering at least the multi-layer metal gate and the gate spacers, and embedded within the second O/D layer comprises: forming a self-assembly monolayer (SAM) layer on a top portion of the multi-layer metal gate; selectively depositing the second O/D layer above the first O/D layer but not above the multi-layer metal gate, forming gate trenches within the second O/D layer; removing the SAM layer from the gate trenches; and forming the self-alignment structure within the gate trenches.

Clause 18. The method of clause 17, wherein forming the self-alignment structure within the gate trenches comprises forming a bi-layer film within the gate trenches.

Clause 19. The method of clause 18, wherein forming the bi-layer film comprises: disposing a first layer within the gate trenches, the first layer comprising silicon nitride (SiN) or silicon dioxide (SiO2); and disposing a second layer above the first layer, the second layer comprising SiN, aluminum nitride (AlN), or silicon carbide (SiC).

Clause 20. The method of any of clauses 14 to 19, wherein providing the first S/D contact that is self-aligned to the self-alignment structure and connected to the first S/D region comprises: etching the second O/D layer above the first S/D region to create a trench with sides delimited by an outside edge of the self-alignment structure; and depositing S/D contact material into the trench.

Clause 21. The method of any of clauses 14 to 20, further comprising providing a second S/D contact that is self-aligned to the self-alignment structure and connected to the second S/D region.

Clause 22. The method of any of clauses 14 to 21, further comprising providing a gate contact that is connected to the multi-layer metal gate through a hole etched through the self-alignment structure.

Clause 23. The method of any of clauses 14 to 22, further comprising providing a third O/D layer disposed above the second O/D layer.

Clause 24. The method of clause 23, further comprising providing at least one of: a S/D via connected to the first S/D contact through the third O/D layer; or a gate contact that is connected to the multi-layer metal gate through the self-alignment structure, and a gate via connected to the gate contact through the third O/D layer.

Clause 25. The method of any of clauses 14 to 24, wherein the FET comprises a planar FET, a finFET, or a gate-all-around (GAA) FET.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A field effect transistor (FET) structure, comprising:

a channel connecting a first source or drain (S/D) region to a second S/D region;

a gate structure, comprising a multi-layer metal gate between gate spacers and separated from the gate spacers by a dielectric material, disposed above a gate region that at least partially surrounds the channel;

a non-conductive self-alignment structure disposed above the gate structure, covering at least the multi-layer metal gate and the gate spacers, and making direct contact with the dielectric material; and a first S/D contact that is self-aligned to the self-alignment structure and connected to the first S/D region.

2. The FET structure of claim 1, further comprising a second S/D contact that is self-aligned to the self-alignment structure and connected to the second S/D region.

3. The FET structure of claim 1, further comprising a gate contact that is connected to the multi-layer metal gate through the self-alignment structure.

4. The FET structure of claim 1, wherein at least one of the first S/D region and the second S/D region comprises an epitaxial layer.

5. The FET structure of claim 1, wherein the dielectric material comprises a high-K dielectric layer at least partially surrounding a work function metal layer.

6. The FET structure of claim 1, wherein the self-alignment structure comprises a bi-layer film.

7. The FET structure of claim 6, wherein the bi-layer film comprises:

silicon nitride (SiN) disposed over silicon dioxide ($SiO_2$);
aluminum nitride (AlN) disposed over SiN; or
silicon carbide (SiC) disposed over SiN.

8. The FET structure of claim 1 at least partially surrounded by a shallow trench isolation (STI) layer.

9. The FET structure of claim 1, wherein the gate structure is embedded within a first oxide or dielectric (O/D) layer.

10. The FET structure of claim 9, wherein the self-alignment structure is embedded within a second O/D layer disposed above the first O/D layer.

11. The FET structure of claim 10, further comprising a third O/D layer disposed above the second O/D layer.

12. The FET structure of claim 11, further comprising at least one of:

a S/D via connected to the first S/D contact through the third O/D layer; or a gate contact that is connected to the multi-layer metal gate through the self-alignment structure, and a gate via connected to the gate contact through the third O/D layer.

13. The FET structure of claim 1, comprising a planar FET, a finFET, or a gate-all-around (GAA) FET.

14. A method for fabricating a field effect transistor (FET), the method comprising:

providing a channel connecting a first source or drain (S/D) region to a second S/D region;

providing a gate structure, comprising a multi-layer metal gate between gate spacers and separated from the gate spacers by a dielectric material, disposed above a gate region that at least partially surrounds the channel and embedded within a first oxide or dielectric (O/D) layer;

providing a non-conducting self-alignment structure disposed above the gate structure, covering at least the multi-layer metal gate and the gate spacers and making direct contact with the dielectric material, and embedded within a second O/D layer disposed over the first O/D layer; and providing a first S/D contact that is self-aligned to the self-alignment structure and connected to the first S/D region.

15. The method of claim 14, wherein at least one of the first S/D region or the second S/D region comprises an epitaxial layer.

16. The method of claim 14, wherein the dielectric material comprises a high-K dielectric layer at least partially surrounding a work function metal layer.

17. The method of claim 14, wherein providing the self-alignment structure disposed above the gate structure, covering at least the multi-layer metal gate and the gate spacers, and embedded within the second O/D layer comprises:

forming a self-assembly monolayer (SAM) layer on a top portion of the multi-layer metal gate;

selectively depositing the second O/D layer above the first O/D layer but not above the multi-layer metal gate, forming gate trenches within the second O/D layer;

removing the SAM layer from the gate trenches; and forming the self-alignment structure within the gate trenches.

18. The method of claim 17, wherein forming the self-alignment structure within the gate trenches comprises forming a bi-layer film within the gate trenches.

19. The method of claim 18, wherein forming the bi-layer film comprises:

disposing a first layer within the gate trenches, the first layer comprising silicon nitride (SiN) or silicon dioxide ($SiO_2$); and disposing a second layer above the first layer, the second layer comprising SiN, aluminum nitride (AlN), or silicon carbide (SiC).

20. The method of claim 14, wherein providing the first S/D contact that is self-aligned to the self-alignment structure and connected to the first S/D region comprises:

etching the second O/D layer above the first S/D region to create a trench with sides delimited by an outside edge of the self-alignment structure; and depositing S/D contact material into the trench.

21. The method of claim 14, further comprising providing a second S/D contact that is self-aligned to the self-alignment structure and connected to the second S/D region.

22. The method of claim 14, further comprising providing a gate contact that is connected to the multi-layer metal gate through a hole etched through the self-alignment structure.

23. The method of claim 14, further comprising providing a third O/D layer disposed above the second O/D layer.

24. The method of claim 23, further comprising providing at least one of:

a S/D via connected to the first S/D contact through the third O/D layer; or a gate contact that is connected to the multi-layer metal gate through the self-alignment structure, and a gate via connected to the gate contact through the third O/D layer.

25. The method of claim 14, wherein the FET comprises a planar FET, a finFET, or a gate-all-around (GAA) FET.

* * * * *